United States Patent
Wang et al.

[11] Patent Number: 5,418,492
[45] Date of Patent: May 23, 1995

[54] FULLY DIFFERENTIAL NON-OP-AMP-BASED POSITIVE FEEDBACK BJT BIQUAD FILTER

[75] Inventors: Chorng-Kuang Wang, Taipei; Chen-Yi Huang, Changhua; Po-Chiun Huang, Taipei; Yuh-Diahn Wang, Hsinchu, all of Taiwan, Prov. of China

[73] Assignee: Industrial Technology Research Institute, Hsinchu, Taiwan, Prov. of China

[21] Appl. No.: 130,631

[22] Filed: Oct. 1, 1993

[51] Int. Cl.$^6$ .................... H03F 3/45; H03F 3/191
[52] U.S. Cl. .................... 330/260; 330/306
[58] Field of Search ............ 330/252, 260, 294, 306, 330/311

[56] References Cited

U.S. PATENT DOCUMENTS

| | | | |
|---|---|---|---|
| 5,105,163 | 4/1992 | Voorman | 330/306 X |
| 5,117,199 | 5/1992 | Wang et al. | 330/252 |
| 5,218,319 | 6/1993 | Takimoto | 330/306 X |

*Primary Examiner*—Steven Mottola
*Attorney, Agent, or Firm*—Bo-In Lin

[57] ABSTRACT

The present invention comprises a fully differential non-op-amp based BJT biquad filter. The biquad filter comprises an unity gain follower receiving a positive and a negative differential input signals for generating a positive and a negative differential output signals. The biquad filter further includes a first positive feedback line connecting the positive output signal to the positive input signal and a second positive feedback line connecting the negative output signal to the negative input signal. The first positive feedback line includes a first capacitor connected in series therein and the second positive feedback line includes a second capacitor connected in series therein wherein the first and the second capacitors are of substantially equal capacitance. The unity gain follower further comprises a plurality of bipolar NPN devices and resistors connected between a common higher DC voltage and a common lower DC voltage through a constant DC current emitter. The unity gain follower is a fully differential follower which further comprises an input voltage shifting stage for receiving and shifting the voltage level of the positive and negative input signals. The unity gain follower further includes a transconductance stage for converting the shifted voltages from the input voltage shifting stage to a positive and a negative current outputs. The unity gain follower further includes a cascode stage for receiving and processing the positive and negative current outputs responsive to the bandwidth of the current outputs to generate a positive and a negative cascoded current outputs. The unity gain follower further has a load stage for receiving the cascoded current outputs to generated a positive and a negative loading voltages. The unity gain follower further includes an output voltage shifting stage for receiving and shifting the loading voltages to generate a positive and a negative shifted output voltages. The unity gain follower further includes an output buffer stage for receiving the shifted output voltages from the output voltage shifting stage and generate a positive and a negative output voltages to provide a low output impedance to the biquad filter.

9 Claims, 3 Drawing Sheets

FULLY DIFFERENTIAL NON-OP-AMP-BASED POSITIVE FEEDBACK BJT BIQUAD FILTER

BACKGROUND OF THE INVENTION

1. Field of the Invention

This invention relates generally to the fully differential non-operational amplifier (non-op-amp) based unity gain filter. More particularly, this invention relates to a fully differential positive feedback bipolar junction transistor (BJT) biquad filter using cascode wide band unity gain buffer.

2. Description of the Prior Art

Because of recent progress made in optical integrated circuits (OICs) technology and optical communication system designs, wide band communication systems such as Fiber Distributed Data Interface (FDDI) and Synchronous Optical Network (SONET) impose greater demand on filter circuit design to achieve high bandwidth requirements in these systems, particularly filters utilized for front end analog applications. As these types of communications systems have data transmission rate ranging from 100 Mbits/sec to 200 Mbits/sec or even higher, the filters used for the analog front end must also achieve high speed operation. Therefore, the design specifications for these filters generally included performance requirements such as high speed, low power consumption, wide dynamic ranges, high noise rejection ratio, and greater scale of integration and packaging.

Most of the conventional types of filters are no longer able to satisfy these requirements. One common filter used in the prior art is a passive type of filters which generally include circuit elements of resistors, capacitors, and inductors, i.e., the R-L-C filters. This type of filters are no longer suitable for most modern electronic applications because of the disadvantages that these circuits have larger volume and that the inductance circuits are not suitable for design and fabrication on ICs with large scale of integration.

Another type of filters commonly used in the prior art is a operational amplifiers based (Op-Amp-based) active filter. This type of filters can be structured in many different forms to implement design factors such as negative or positive feedback, single ended or fully differential. The structures of this type of filters are altered to achieve various design purposes such as application of the filter as a unity gain follower, for increasing the noise rejection ratio, or for lowering the power consumption requirements. This type of filters are however not suitable for wide band communication application due to the speed limitation of the Op-Amp-based filters.

One specific prior art fully differential op-amp-based filter is a dual single-ended operational filter, or generally known as Allen-Key filter, which is used to achieve unity gain. However, this type of filters are not implemented due to the poor noise rejection and hence poor dynamic range.

Wang et al. discloses in U.S. Pat. No. 5,117,199 entitled 'Fully Differential Follower Using Operational Amplifier' (issued on May 26, 1992) a fully differential amplifier with a unity gain. The amplifier includes a differential input stage having two pairs of differential inputs. One pair receives the input signal. The other pair is connected internally to receive differential mode feedback from the output stage.

These two pairs of differential inputs are combined with a common node feedback signal and cascoded to the output. The amplifier incorporates automatic internal noise cancellation due to its differential mode feedback. Construction of the circuits by the use of CMOS or BiCMOS technology is disclosed which may be applied for a higher frequency of operation up to 10 MHz. Due to the general characteristics of the op-amp-based unit gain filter, the technique disclosed by Wang et al. has a slower frequency response. Therefore, the achievable bandwidth is not sufficient for application to filters to be operated at higher frequency range which is now required in modern data processing, transmission and communication applications.

A non-op-amp based active filter is disclosed by Chung-Yu Wu et al. ('Design Techniques for High-Frequency CMOS Switched Capacitor filters Using Non-Op-Amp-Based Unity-Gain Amplifiers', IEEE Journal of Solid State Circuits, Vol. 26, No. 10, October 1991). A fully differential non-op-amp-based unity gain amplifier is disclosed. The disclosed filter has a normal gain of unity but it has greater bandwidth, better settling behavior, smaller chip area, and less transistors and thus can be used to replace unity-gain buffers (UCBs) which is the amplifiers used in the switched-capacitor (SC) filters with high gain op-amps and unity-gain feedback. Furthermore, since the error caused by the nonlinear parasitic capacitance and process variations can be compensated by tuning the gain of the filter, this filter can be used in a switched-capacitor filters (SCFs) operated in a relatively higher frequency range with lower parasitic errors.

However, the filter as disclosed by Wu at al. has the limitations that the precision of the filter is affected by the mismatch between CMOS devices. Additionally, the speed of the filter is still limited by the parasitic capacitance when a CMOS technology is applied. The parasitic capacitance which exits generally between the source and the gate of a CMOS transistor typically is in the order of few pico-farad. Due to this parasitic capacitance, the filter cannot achieve a frequency level in the range over 100 MHz.

The techniques offered by the prior art are still limited by several major difficulties including the limitations of bandwidth and device mismatches. Furthermore, in order to achieve higher bandwidth operation, external devices are often employed which causes the difficulties in non-integrability and size limitation in integrated circuit (IC) implementation. These difficulties have caused adverse effects on system performance, power management, cost and reliability.

Therefore, there is still a need in the art of non-op-amp-based filters and their application in wide band communication system design to have a fully-differential filter which is suitable for high bandwidth application and which also has improved power supply rejection ratio and dynamic range.

SUMMARY OF THE PRESENT INVENTION

It is therefore an object of the present invention to provide a fully differential non-op-amp-based positive feedback BJT biquad filter to overcome the aforementioned difficulties encountered in the prior art.

Specifically, it is an object of the present invention to provide a fully differential non-op-amp-based positive feedback BJT biquad filter without requiring external components for frequency application.

Another object of the present invention is to provide a fully differential non-op-amp-based positive feedback BJT biquad filter wherein the gain is generated by the ratio of a load and a degeneration resistor which can be precisely tuned to be very close to a value of one.

Another object of the present invention is to provide a fully differential non-op-amp-based positive feedback BJT biquad filter wherein common-emitter and common-base stages are used to eliminate the Miller parasitic capacitance.

Another object of the present invention is to provide a fully differential non-op-amp-based positive feedback BJT biquad filter wherein the poles of the circuits which would limit the speed of the filter are set to a very high frequency suitable for application in a high bandwidth communication network.

Briefly, in a preferred embodiment, the present invention comprises a fully differential non-op-amp based BJT biquad filter. The biquad filter comprises an unity gain follower receiving a positive and a negative differential input signals for generating a positive and a negative differential output signals. The biquad filter further includes a first positive feedback line connecting the positive output signal to the positive input signal and a second positive feedback line connecting the negative output signal to the negative input signal. The first positive feedback line includes a first capacitor connected in series therein and the second positive feedback line includes a second capacitor connected in series therein wherein the first and the second capacitors are of substantially equal capacitance. The unity gain follower further comprises a plurality of bipolar NPN devices and resistors connected between a common higher DC voltage and a common lower DC voltage through a constant DC current source $I_{dc}$. The unity gain follower is a fully differential follower which further comprises an input voltage shifting stage for receiving and shifting the voltage level of the positive and negative input signals. The unity gain follower further includes a transconductance stage for converting the shifted voltages from the input voltage shifting stage to a positive and a negative current outputs. The unity gain follower further includes a cascode stage for receiving and processing the positive and negative current outputs responsive to the bandwidth of the current outputs to generate a positive and a negative cascoded current outputs. The unity gain follower further has a load stage for receiving the cascoded current outputs to generated a positive and a negative loading voltages. The unity gain follower further includes an output voltage shifting stage for receiving and shifting the loading voltages to generate a positive and a negative shifted output voltages. The unity gain follower further includes an output buffer stage for receiving the shifted output voltages from the output voltage shifting stage and generate a positive and a negative output voltages to provide a low output impedance to the biquad filter.

It is an advantage of the present invention that it provides a fully differential non-op-amp-based positive feedback BJT biquad filter without requiring external components for high frequency application.

Another advantage of the present invention is that it provides a fully differential non-op-amp-based positive feedback BJT biquad filter wherein the gain is generated by the ratio of a load and a degeneration resistor which can be precisely tuned to be very close to a value of one.

Another advantage of the present invention is that it provides a fully differential non-op-amp-based positive feedback BJT biquad filter wherein common-emitter and common-base stages are used to eliminate the Miller parasitic capacitance.

Another advantage of the present invention is that it provides a fully differential non-op-amp-based positive feedback BJT biquad filter wherein the poles of the circuits which would limit the speed of the filter are set to a very high frequency suitable for application in a high bandwidth communication network.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
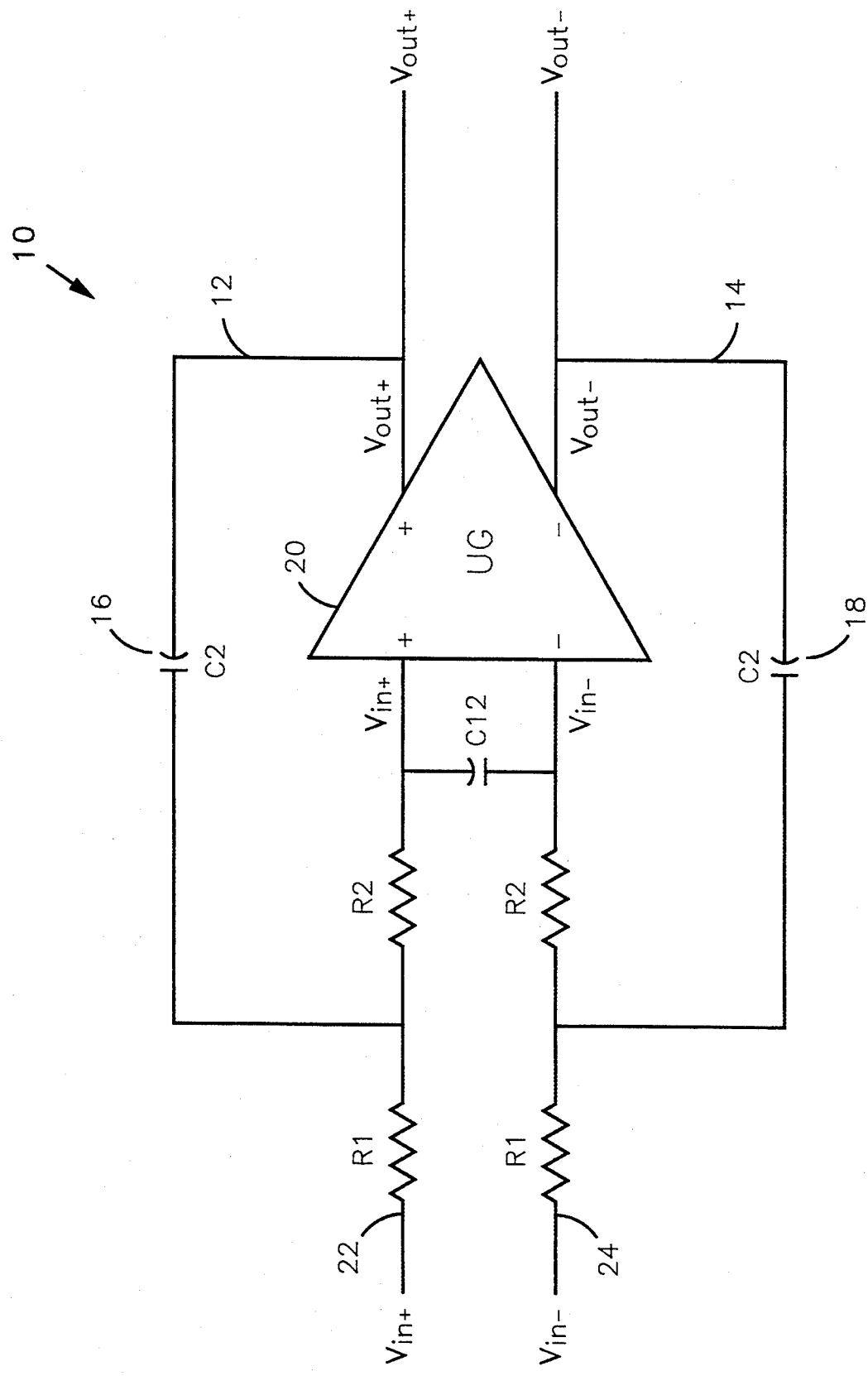
FIG. 1 is a schematic diagram showing the circuit architecture of a fully differential non-op-amp-based positive feedback BJT biquad filter according to the present invention.

FIG. 1 shows a fully differential non-op-amp-based positive feedback BJT biquad filter 10, also referred in this patent application as the biquad filter 10, illustrating the circuit architecture of the present invention. The fully-differential positive feedback biquad filter 10 generally comprises a unit gain follower 20 with one pair of differential inputs, i.e., Vin+ and Vin−, and one pair of differential outputs, i.e., Vout+ and Vout−. The differential mode positive feedback is provided from Vout+ to Vin+ and Vout− to Vin− via a feedback line 12 and 14 respectively wherein each of the feedback line has a capacitor 16 and 18 connected in series thereon of substantially equal capacitance. Each of the input line pair, i.e., input lines 22 and 24, further has a resistor pair, i.e., R1, before the connection point of with the feedback lines 12 and 14 and another pair of resistors, i.e., R2 after the connection points of the feedback lines 12 and 14 to the input lines 22 and 24. A capacitor $C_{12}$ between the input lines 22 and 24 represents the parasitic capacitance at the input end of the unit gain follower 20. This circuit architecture for the fully differential positive feedback biquad filter 10 as disclosed in the present invention provides a high input impedance and low output impedance biquad filter. It has the advantages that high frequency application is feasible with a filter occupying less chip area since it does not require external components, and the filter may be used in a wide band communication network since the poles of the circuit in unit gain follower 20 are set at very high frequency.

One unique feature of this invention is its implementation of a fully differential non-amp-based architecture as that shown for the biquad filter 10 on a Sallen-Key type of filter. A description of the operational principle of a Sallen-Key filter is provided in Chapter 6 of Analogy Filter Design by M. E. Van Valkenburg and the content of that Chapter is incorporated herein by reference. By the use of the fully differential non-amp-based architecture, the major difficulty of a conventional Sallen-Key filter, i.e., a poor dynamic range caused by the poor performance in noise rejection range, is eliminated.

Figure 2:
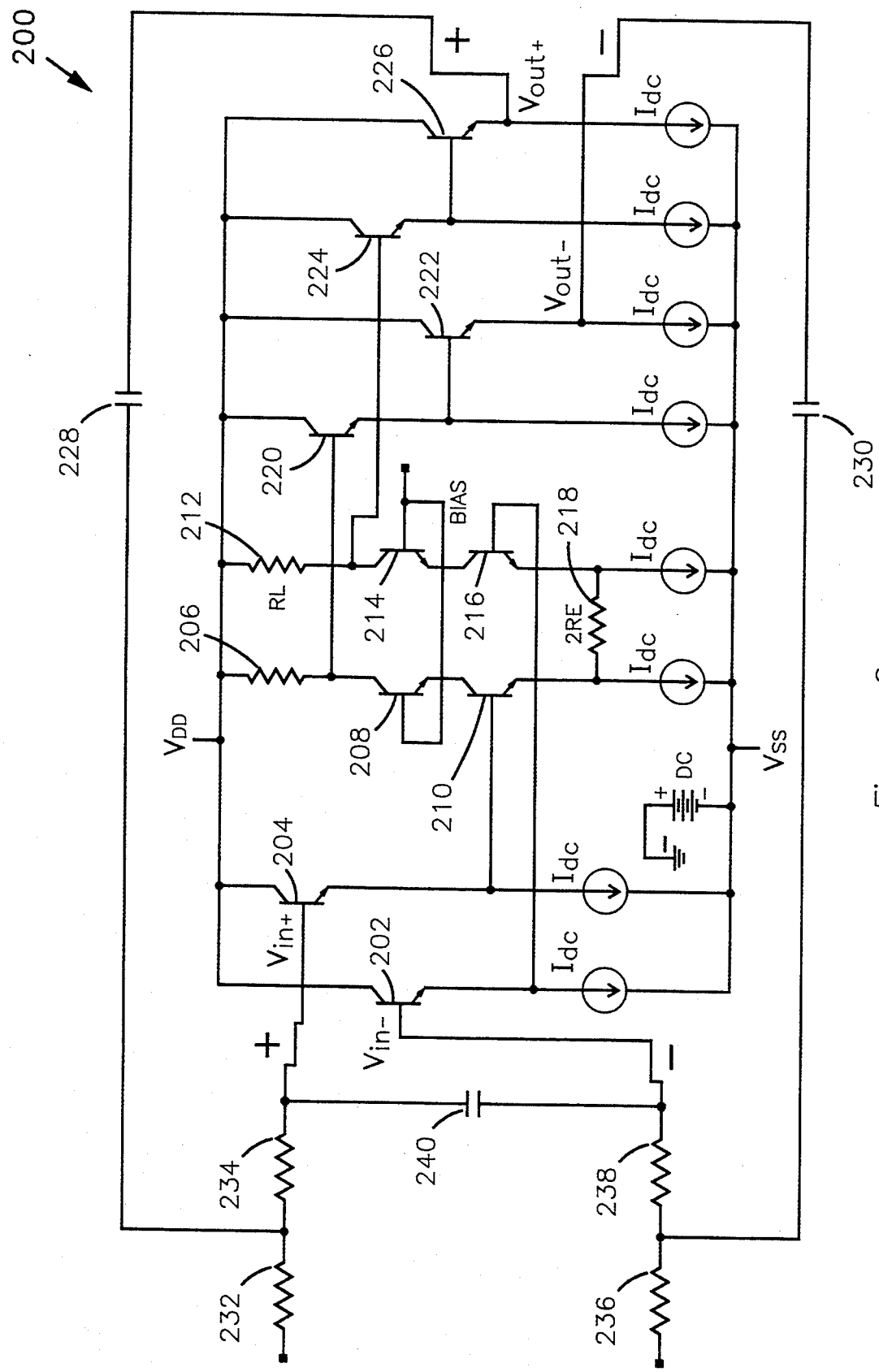
FIG. 2 is a functional block diagram of a fully differential non-op-amp-based positive feedback BJT biquad filter according to the present invention.

FIG. 2 is a circuit diagram of the fully differential positive feedback bipolar junction transistor (BJT) biquad filter 10 wherein the design utilizes the bipolar technology to achieve high speed. The entire circuit utilizes bipolar NPN devices and can be fully integrated and fabricated on a single chip or be included and integrated as part of other ICs. A device 202 has a collector connected to the $V_{DD}$, a base connected to the negative input Vin−, and an emitter connected to the base of a device 216 and to the $V_{ss}$ via a current source $I_{dc}$. A device 204 has a collector connected to the $V_{DD}$, a base connected to the positive input Vin+, and an emitter connected the base of a device 210 and to the $V_{ss}$ via a current source $I_{dc}$. A device 208 has a collector which is connected to the $V_{DD}$ via a resistor 206. The device 208 has a base connected to the base of a device 214 and an emitter connected to the collector of a device 210. The device 210 has a collector and a base connected as described above, and a emitter connected to the $V_{ss}$ via a current source $I_{dc}$ and to the emitter of a device 216 via a resistor 218. The device 214 has a collector connected to the $V_{DD}$ via a resistor 212 and to the base of a device 224. The device 214 has a base connected as described above. The device 214 has an emitter connected to the collector of a device 216. The device 216 has a collector and a base connected as described above, and an emitter connected to $V_{ss}$ and to the emitter of the device 210 via the resistor 218 as described above.

The circuit connections between the devices 210, 216 and the resistor 218 may be alternatively configured such that the emitter of the device 210 is connected to a resistor 218-1 (not shown) with a resistance of $R_E$ and the emitter of the device 216 is also connected to a resistor 218-2 (not shown) with a resistance of RE, then the resistors 218-1 and 218-2 are connected together for connecting to the $V_{ss}$ via a current source $I_{dc}$. A person of ordinary skill in the art would be taught to design the circuit with alternate circuit configurations according to the principle and techniques disclosed in FIG. 2 of the present invention. Detail explanation with another drawing showing alternate circuit connectivity is therefore not necessary.

The device 220 has a collector connected to the $V_{DD}$ and a base connected as described above. The device 220 has an emitter connected to $V_{ss}$ via a current source $I_{dc}$ and to the base of a device 222. The device 222 has a collector connected to the $V_{DD}$ and a base connected as described above. The device 222 has an emitter connected to $V_{ss}$ via a current source $I_{dc}$ and to a negative output line Vout−. The device 224 has a collector connected to the $V_{DD}$ and a bas connected as described above. The device 224 has an emitter connected to the base of a device 226 and to $V_{ss}$ via a current source $I_{dc}$. The device 226 has a collector connected to $V_{DD}$ and a base connected as described above. The device 226 has an emitter has an emitter connected to the $V_{ss}$ via a current source $I_{dc}$ and to the positive output line Vout+.

In operation, the circuit elements 202 to 226 forms a unit gain follower 20 as illustrated in FIG. 1. It is a fully differential unity gain follower with high input impedance and low output impedance. The combination of the device 204, the device 210, and the resistor 218 generates a high input impedance with a value of $\beta \times \beta \times R_E$ where $\beta$ is the impedance of the devices 204 and 210 and $2R_E$ is the resistance of the resistor 218. The devices 202, 216 and the resistor 218 forms a fully differential circuit combination with that formed by the devices 204, 210 and the resistor 218. Meanwhile, the devices 210 and 216 form a emitter coupled pair for the devices 208 and 214 which are combined to become a cascode or a common emitter and common base stage to achieve the purpose of eliminating the Miller parasitic capacitance and to increase the achievable bandwidth of the biquad filter 10. The unity gain which is generated by the combination of circuit elements of the devices 206, 212, and the resistor 218 in the unity gain follower circuit is achieved by making the value of resistance $R_E = R_L$. The devices 220 and 222 are emitter follower which may be used to tune the output voltage to the desired value thus generating a low output impedance with a value of $R_L/\beta^2$. The devices 224 and 226 form a differential combination for the devices 220 and 222 thus making the unity gain follower a fully-differential unity gain follower 200.

Figure 3:
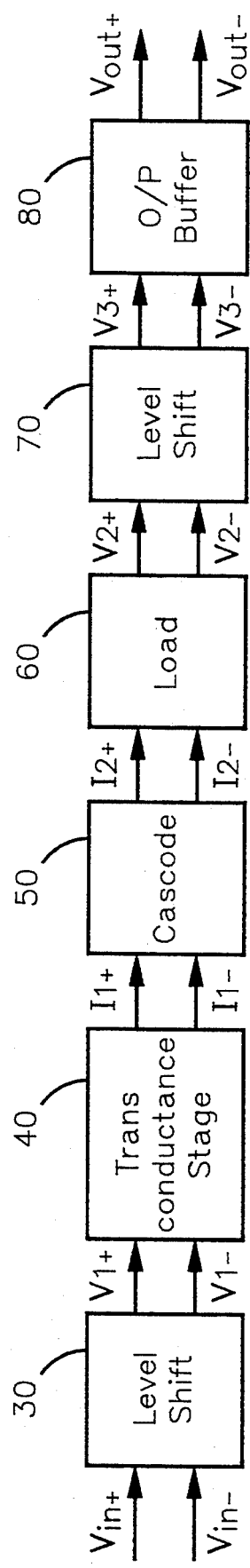
FIGS. 3 is a circuit diagram of a fully differential non-op-amp-based positive feedback BJT biquad filter according to a preferred embodiment of the present invention.

FIG. 3 shows a block diagram of the internal structure of the fully differential positive feedback unity gain follower 20. The pair of differential inputs, i.e., $V_{in+}$ and $V_{in-}$, are first connected to a level shifting circuit 30 which comprises devices 202 and 204 to shift the voltage level to match the working voltage of a next stage. The level shifting is accomplished by the voltage drop between the base and emitter of the 202 and 204 devices. The shifted voltage outputs, i.e., $V1_+$ and $V1_-$ are then processed by a transconductance stage 40 which comprises devices 210 and 216 to convert the shifted voltages $V1_+$ and $V1_-$ to two corresponding output currents, i.e., I1+ and I1− respectively. The converted currents I1+ and I1− are then received into a cascode stage 50 comprising of the devices 208 and 214 to increase the bandwidth of the signal. The output currents $I_2+$ and $I_2-$ of the cascode stage 50 is coupled to a loading stage 60 comprising a pair of load devices, i.e., devices 206 and 212 to generate two loading voltages, V2+ and V2− wherein the gain of the of the signal is determined by the circuit characteristics of the device 218. The loading voltages V2+ and V2− are further shifted by another level shifting stage, i.e., output shifting stage 70 which comprises 220 and 224 to further fine tune the voltage for matching to the next stage of circuits (not shown). The shifted output voltages V3+ and V3− from the output shifting stage 70 are further transmitted through an output low-impedance buffer 80 comprising the devices 222 and 226 which generates in combination with the output level shifting stage 70 the output voltage V$_{out}$+ and V$_{out}$− and to provide a low output impedance for the biquad filter 10.

Please referring to FIGS. 2 and 3, the transconductance stage 40 comprises a pair of common emitter NPN devices 210 and 216 forming an emitter coupling pair of the cascode stage 50 comprising a pair of common base NPN devices 208 and 214. The transconductance stage 40 comprises an emitter resistor 218, having a resistance of $2R_E$, connecting the common emitters of the common emitter NPN devices 210 and 216. The load stage 60 further comprises a pair of resistors 212 and 206 each having a resistance of RL and each being connected between the higher common voltage and the collector of the common base NPN devices 208 and 214 of the cascode stage 50. The resistance $R_E$ is substantially of the same value as the resistance $R_L$ whereby the gain of the unity gain follower is substantially of a value of unity. The input voltage shifting stage 30 comprises a pair of common-collector-common-emitter NPN devices 202 and 204 wherein the common collector being connected to the higher common voltage and the common emitter being connected to the lower common voltage. The positive and the negative differential input signals each being received by a base of one of the common-collector-common-emitter NPN 10 devices 202 and 204 wherein each of the shifted input voltages is generated from the emitter of each of the common-collector-common-emitter NPN devices 202 and 204 for inputting to the base of each of the NPN devices 210 and 216 of the transconductance stage 40. The output buffer stage 80 comprises a pair of common emitter NPN devices 222 and 226 with the common emitter connected to the lower DC voltage. The output voltage shifting stage 70 comprises a pair of common collector NPN devices 220 and 224 with the common collector connected to the higher common DC voltage. Each of the pair of common NPN devices 222 and 226 of the output buffer stage 80 is a emitter follower of one of the pair of common collector NPN devices 220 and 224 of the output voltage shifting stage 70. Each of the pair of resistors 206 and 212 of the load stage 60 connected in parallel between the higher common DC voltage and the base of each of the common collector NPN devices 220 and 224 of the output voltage shifting stage 70. Each of the positive and negative differential output signals is generated from each of the emitters of the pair of common emitter NPN devices 222 and 226 of the output buffer stage 80.

Therefore, by utilizing the unity gain follower 200 in this fully differential filter 10, an apparatus which can be incorporated in a wide band high frequency application is disclosed according to this invention. The difficulties which are encountered in the prior art including the limitations of bandwidth, poor noise rejection ratio, and the input and output impedance mismatches are now resolved by the present invention.

The circuit techniques of this cascode unity gain filter 10 to achieve wide band operation ranges have several advantages. The gain of the filter can be fine tuned by the use of the ratio of the load and degeneration resistors, i.e., $R_1/R_e$. By adjusting the resistance of $R_1$ and $R_e$, a very close to unity gain is obtained. The parasitic capacitance caused by the Miller effect is eliminated by the use of the common base. The poles of the circuit which limits the speed of the filter are set at very high frequencies. These poles can be either generated from the transistor's unity gain frequency which is around seven GHz for a typical bipolar junction transistor (BJT) technology, or it can be generated from the load resistor, i.e., $$F_t = 1/(R_{out}C_{out})$$

where Ft is the value of the frequency of one of the poles generated from the load resistor Rout and the output capacitor $C_{out}$. Again by properly selecting the output resistor and capacitor, a very high frequency can be generated for the frequency of the pole $F_t$. A circuit designer is thus provided with great deal of flexibility to design the wide band unity gain BJT biquad filter which can be optimally tuned for the communication or digital signal processing systems wherein the filter is to be implemented.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A full differential non-op-amp based BJT biquad filter comprising:
   an unity gain follower receiving a positive and a negative differential input signals for generating a positive and a negative differential output signals;
   a first positive feedback line connecting said positive output signal to said positive input signal and a second positive feedback line connecting said negative output signal to said negative input signal;
   said first positive feedback line including a first capacitor connected in series therein and said second positive feedback line including a second capacitor connected in series therein wherein said first and said second capacitors being of substantially equal capacitance;
   said unity gain follower being a fully differential follower including an input voltage shifting stage for receiving and shifting the voltage level of said positive and negative input signals;
   said unity gain follower further including a transconductance stage for converting said shifted voltages from said input voltage shifting stage to a positive and a negative current outputs;
   said unity gain follower further including a cascode stage for receiving and processing said positive and negative current outputs responsive to the bandwidth of said current outputs to generate a positive and a negative cascoded current outputs;
   said unity gain follower further including a load stage for receiving said cascoded current outputs to generated a positive and a negative loading voltages;
   said unity gain follower further including an output voltage shifting stage for receiving and shifting said loading voltages to generate a positive and a negative shifted output voltages; and
   said unity gain follower further including an output buffer stage for receiving said shifted output voltages from said output voltage shifting stage and generate a positive and a negative output voltages to provide a low output impedance to said biquad filter.

2. The BJT biquad filter of claim 1 wherein:
   said transconductance stage comprises a pair of common emitter NPN devices forming an emitter coupling pair of said cascode stage comprising a pair of common base NPN devices.

3. The BJT biquad filter of claim 2 wherein:
   said transconductance stage comprises an emitter resistor, having a resistance of $2R_E$, connecting said common emitters of said common emitter NPN devices;
   said load stage further comprising a pair of resistors each having a resistance of $R_L$ and each being connected between said higher common voltage and the collector of said common base NPN devices of said cascode stage; and
   said resistance $R_E$ is substantially of the same value as said resistance $R_L$ whereby the gain of said unity gain follower is substantially of a value of unity.

4. The BJT biquad filter of claim 3 wherein:

said input voltage shifting stage comprises a pair of common-collector-common-emitter NPN devices wherein said common collector being connected to said higher common voltage and said common emitter being connected to said lower common voltage; and said positive and said negative differential input signals each being received by a emitter of one of said common-collector-common-emitter NPN devices wherein each of said shifted input voltages is generated from the emitter of each of said common-collector-common-emitter NPN devices for inputting to the base of each of the NPN devices of said transconductance stage.

5. The BJT biquad filter of claim 4 wherein:

said output buffer stage comprising a pair of common emitter NPN devices with the common emitter connected to said lower DC voltage;

said output voltage shifting stage comprising a pair of common collector NPN devices with the common collector connected to said higher common DC voltage; and each of said pair of common NPN devices of said output buffer stage is a emitter follower of one of said pair of common collector NPN devices of said output voltage shifting stage.

6. The BJT biquad filter of claim 5 wherein:

each of said pair of resistors of said load stage connected in parallel between said higher common DC voltage and the base of each of said common collector NPN devices of said output voltage shifting stage.

7. The BJT biquad filter of claim 6 wherein:

each of said positive and negative differential output signals is generated from each of the emitters of said pair of common emitter NPN devices of said output buffer stage.

8. A full differential non-op-amp based BJT biquad filter comprising:

an unity gain follower receiving a positive and a negative differential input signals for generating a positive and a negative differential output signals;

a first positive feedback line connecting said positive output signal to said positive input signal and a second positive feedback line connecting said negative output signal to said negative input signal;

said first positive feedback line including a first capacitor connected in series therein and said second positive feedback line including a second capacitor connected in series therein wherein said first and said second capacitors being of substantially equal capacitance;

said unity gain follower further comprises a plurality of bipolar NPN devices and resistors connected between a common higher DC voltage and a common lower DC voltage through a constant DC current emitter;

said unity gain follower being a fully differential follower further comprising:

an input voltage shifting stage for receiving and shifting the voltage level of said positive and negative input signals;

a transconductance stage for converting said shifted voltages from said input voltage shifting stage to a positive and a negative current outputs;

a cascode stage for receiving and processing said positive and negative current outputs responsive to the bandwidth of said current outputs to generate a positive and a negative cascoded current outputs;

a load stage for receiving said cascoded current outputs to generated a positive and a negative loading voltages;

an output voltage shifting stage for receiving and shifting said loading voltages to generate a positive and a negative shifted output voltages; and an output buffer stage for receiving said shifted output voltages from said output voltage shifting stage and generate a positive and a negative output voltages to provide a low output impedance to said biquad filter.

9. A full differential non-op-amp based BJT biquad filter comprising:

a non-operational amplifier (NON-OP AMP) based unity gain follower receiving a positive and a negative differential input signals for generating a positive and a negative differential output signals;

said NON-OP AMP based unity gain follower further includes a BJT common emitter amplifier including a first pair of common emitter transistors wherein said common emitters being degenerated by a common emitter resistor which being connected to a direct current source (IDC);

the collectors of said pair of common emitter transistors being cascoded by a BJT common base stage including a second pair of transistors wherein said common base of said second pair of transistors being connected to a direct current voltage ($V_{DD}$) via a load resistor with a resistance equivalent to the resistance of said common-emitter resistor;

said NON-OP AMP based unity gain follower further includes a low impedance output buffer circuit including a plurality of pair of transistors being connected from the collectors of said second pair of transistors;

each transistor of said first pair, said second pair, and said plurality pairs of transistors being pairwise equivalent and symmetrical in circuit connection whereby a fully differential unity gain follower is formed;

a first positive feedback line connecting said positive output signal to said positive input signal and a second positive feedback line connecting said negative output signal to said negative input signal; and said first positive feedback line including a first capacitor and resistor connected in series therein and said second positive feedback line including a second capacitor and resistor connected in series therein wherein said first and said second capacitors being of substantially equal capacitance, and said first and said second resistors being of substantially equal resistance whereby a fully differential, positive feedback open-loop circuit is formed.

* * * * *